United States Patent [19]
Gordon

[11] 3,947,786
[45] Mar. 30, 1976

[54] SUPPORT STRUCTURE FOR PUSHBUTTON RADIO TUNER ASSEMBLY

[75] Inventor: Frank John Gordon, Chicago, Ill.

[73] Assignee: Motorola, Inc., Chicago, Ill.

[22] Filed: May 2, 1975

[21] Appl. No.: 574,190

[52] U.S. Cl. .................................. 334/7; 74/10.33
[51] Int. Cl.² ...................... H03J 5/32; F16H 35/18
[58] Field of Search ............. 334/7; 74/10.33, 10.37

[56] References Cited
UNITED STATES PATENTS
3,463,017   8/1969   Stamm et al. ..................... 334/7 X
FOREIGN PATENTS OR APPLICATIONS
37,689   11/1971   Japan ...................................... 334/7

*Primary Examiner*—Paul L. Gensler
*Attorney, Agent, or Firm*—James W. Gillman; Margaret M. Parker

[57] ABSTRACT

An extremely rigid support structure for mounting the tuning coils and for guiding the movement of the core carriage, includes a coil case which is a one-piece molded element having integral indicator guide slot and core carriage guide rods, with the guide rods being fastened to the front portion of the structure by means of screws which pass through the front portion and mate with threaded apertures in the guide rod ends which are in abutting relation with the front portion.

5 Claims, 3 Drawing Figures

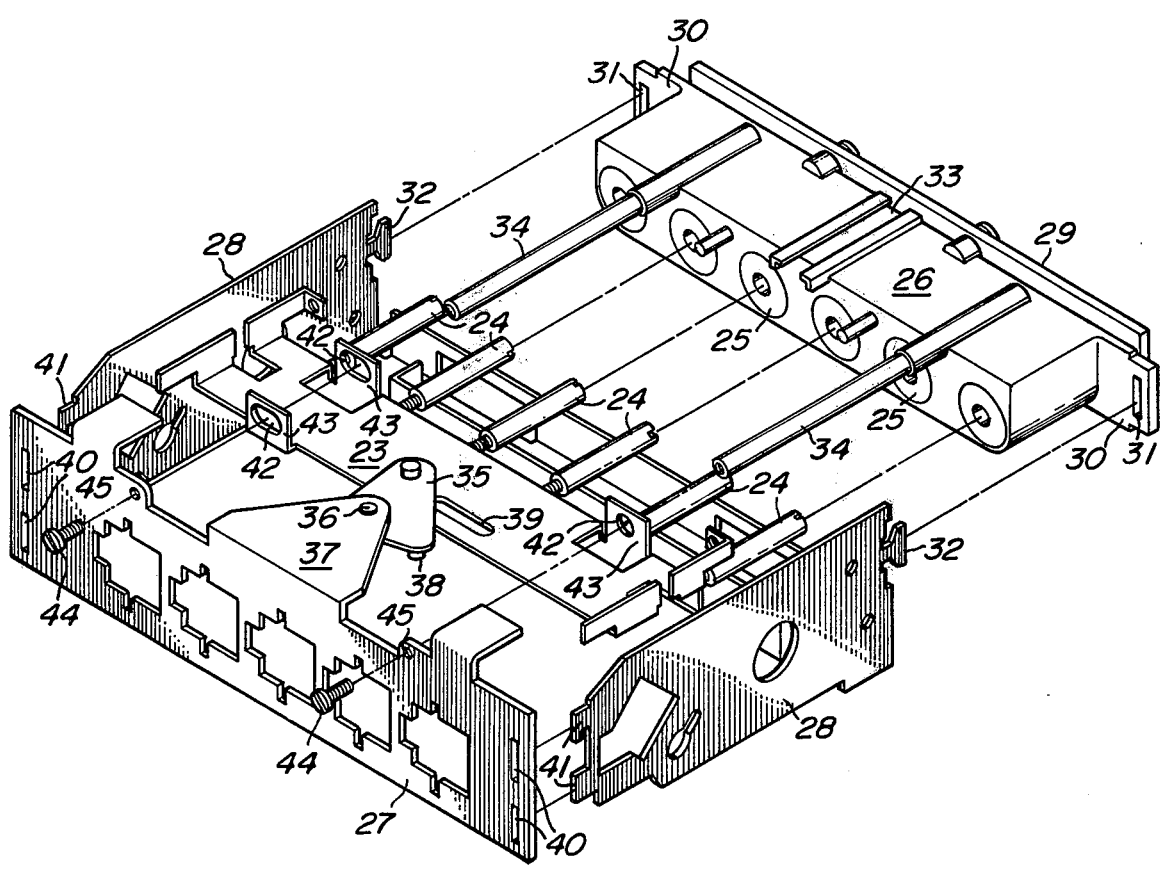

SUPPORT STRUCTURE FOR PUSHBUTTON RADIO TUNER ASSEMBLY

BACKGROUND OF THE INVENTION

1. Field of the Invention

This invention relates to the field of radio tuners and more specifically to the design of a tuner assembly which is sufficiently rigid to prevent significant frequency deviation caused by flexing and deformation of the support structure.

2. Prior Art

As tuner designs have become more sophisticated and at the same time more standardized, many attempts have been made to eliminate the remaining defects. One of these defects is a tendency for the frequency to shift due to deformation of the supporting structure particularly when selecting predetermined frequencies by operation of the pushbuttons. The criticality of this becomes apparent when it is realized that a longitudinal movement of only 0.0004 inches (0.01 mm) by a core within a coil can cause frequency change of as much as 1 kH. With the necessarily light weight of tuner support structures, a shift of this magnitude can be caused by many factors, pressure against the front support plate being one of the most important. While some previous tuner designs have combined the guide rods for the core carriage assembly with the coil housing, they have still served only for core carriage guidance. Therefore, the ends of the guide rods were merely brought through apertures in the front plate and left free. While this type of design serves for general guidance of the core carriage motion, it does little to stabilize or rigidize the entire structure. In particular, such a design fails to maintain the front-to-back dimension constant or provide improved alignment of the cores within the tuning coils.

SUMMARY OF THE INVENTION

It is therefore an object of this invention to provide a stronger, more rigid support structure for a radio tuner.

It is a specific object to provide this added rigidity particularly in regard to the front support plate.

It is a particular object of the invention to gain by this greater rigidity an improvement in frequency stability under stress.

The present invention accomplishes the above-mentioned objectives by means of an improved structural design. The housing for all of the tuning coils is cast in one piece and includes, integrally, the guide slot for the dial indicator mechanism and the core carriage guide rods. The guide rods are extended to the front support plate and are firmlly mounted to the plate by machine screws which extend through the front plate and mate with a threaded aperture in the end of each guide rod. This configuration virtually eliminates flexing or yielding in the support structure, thus preventing displacement of the coil cores within the coils due to such dimensional changes.

BRIEF DESCRIPTION OF THE DRAWING

FIG. 3 is an exploded perspective view of the support structure of the tuner according to the invention.

DETAILED DESCRIPTION OF A PREFERRED EMBODIMENT

Figure 1:
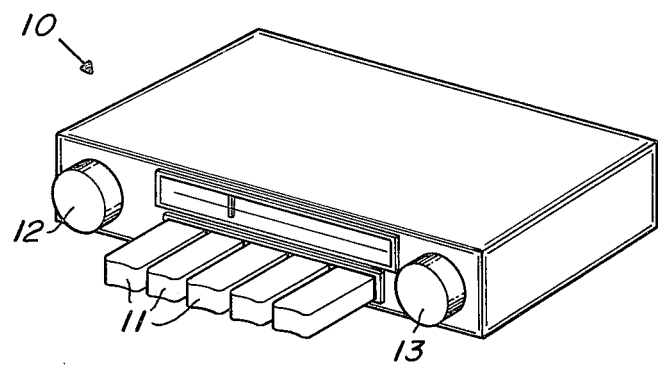
FIG. 1 is a general perspective view of a pushbutton tuner including the improved tuning mechanism support structure according to the invention.

Referring now to the drawing wherein like numbers have been employed throughout to designate like components, there is illustrated in FIG. 1 a typical radio tuner 10 utilizing pushbutton 11 for selecting certain predetermined frequencies. A knob 12 controls the combined on-off switch and volume control. A knob 13 provides continuously variable control of the tuning drive mechanism 14 (FIG. 2).

Figure 2:
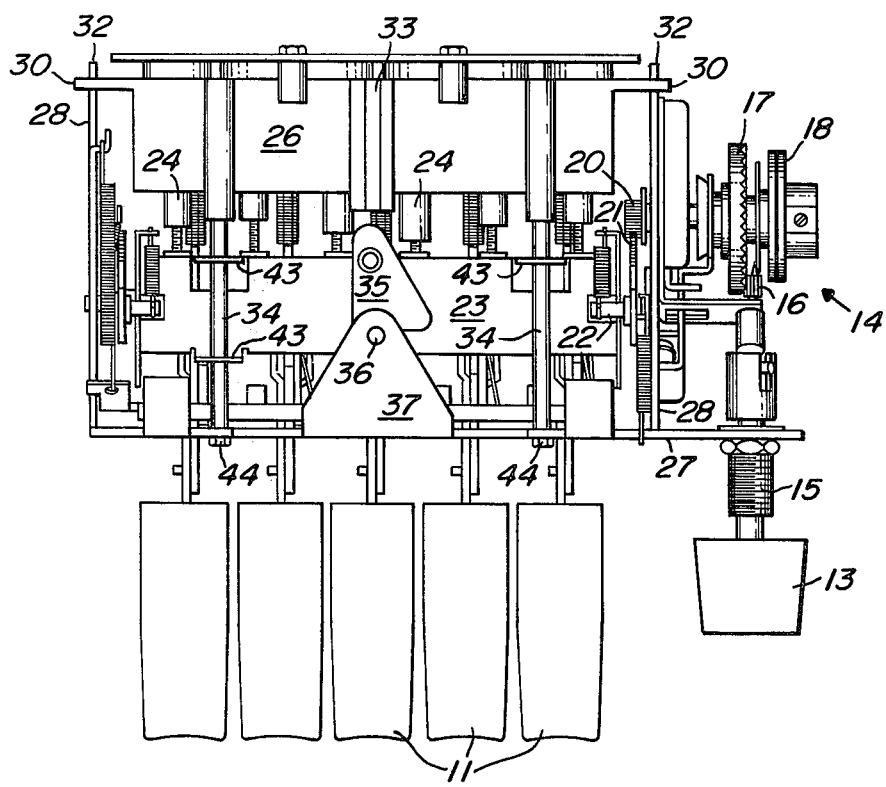
FIG. 2 is a partial top view of the interior of the tuner.

Referring now to FIGS. 2 and 3, the tuning drive mechanism 14 includes the tuning knob 13 and a shaft 15 having a pinion gear 16 on its inner end which coacts with a crown gear 17, a clutch mechanism 18 and gears 20 and 21 to drive a treadle bar mechanism 22 (partially shown). As is known in the art, the rotation of the treadle bar mechanism, is translated into reciprocal movement of a core carriage 23 for moving a plurality of cores 24 into and out of a like number of tuning coils 25. All of the tuning coils are retained in a one-piece molded coil housing 26 which, with a front support plate 27 and a support frame 28 supports the entire tuning mechanism. A terminal board 29 is mounted on the back of the coil housing 26 for making electrical connections to the coils contained in the housing. The coil housing 26 includes integrally cast, laterally extending members 30 with apertures 31 for receiving two tabs 32 of the support frame 28, by which means mechanical and electrical connections are made. The housing also includes an integrally cast guide slot 33 and two guide rods 34. The guide slot and a crank 35, pivotally mounted by a pin 36 on a tab portion 37 of the front support plate 27 and having a pin 38 on the crank 35 for coacting with a slot 39 in core carriage 23, form portions of the dial indicator assembly (remaining parts not shown). Crank 35 operates the pointer assembly in a manner known in the art in response to core carriage movements. Guide slot 33 guides the pointer assembly in a manner known in the art by receiving a guided portion slideably therein. The front support plate 27 is joined to the support frame 28 by means of apertures 40 in the front plate and tabs 41 on the frame. The guide rods 34 of the coil housing 26 support and guide the motion of the core carriage 23 by means of three apertures 42 in three tab portions 43 of the core carriage. The outermost ends of the guide rods 34 are internally threaded to mate with two screws 44 which pass through apertures 45 in the front support plate 27. A significant measure of strength and rigidity is thereby added to the overall structure and, in particular, the front-to-back dimension of the structure and the positioning of the cores within the coils are maintained to very close tolerances. Thus the general operation and frequency stability of the tuner are greatly improved under conditions of physical stress applied to the tuner.

I claim:

1. In the tuner for a radio receiver, a tuning assembly comprising:
    a plurality of coils for tuning the receiver;
    carriage means adapted for reciprocating movement;
    drive means for moving the carriage means;
    manual control means for controlling the drive means to select a desired frequency;
    pushbutton control means for predetermining certain desired frequencies and for selecting one of the predetermined frequencies;

a plurality of tuning coil cores mounted on the carriage means for movement therewith, the movement of the cores being within and coaxial with the coils;

a support structure having a front portion and rear portion, the latter portion including as one portion thereof a one-piece molded housing for receiving all of the tuning coils;

first guide means integral with the housing for guiding the movement of the core carriage;

screw means for fastening the first guide means to the front portion of the support structure, the front portion having apertures for allowing passage of the screw means;

threaded means integral with the first guide means for receiving the screw means, whereby the front-to-back dimension of the support structure remains substantially constant.

2. A tuning assembly according to claim 1 and wherein the outer ends of the first guide means are in abutting relationship with the front portion of the support structure when the screw means are mated with the threaded means.

3. A tuning assembly according to claim 1 and further including an insulating terminal board mounted on the back of the one-piece housing for making electrical contact with the tuning coils housed therein.

4. A tuning assembly according to claim 1 and further including an indicator assembly pivotally and slideably mounted for indicating the particular frequency chosen, and second guide means integral with the housing for guiding the movement of the indicator assembly.

5. A tuning assembly according to claim 4 wherein the second guide means is a formed slot, and further including a bell crank pivotally mounted on a portion of the support structure, and wherein the indicator assembly is pivotally mounted on the bell crank and slideably mounted in the formed slot.

* * * * *